(12) United States Patent
Chen et al.

(10) Patent No.: US 9,224,646 B2
(45) Date of Patent: Dec. 29, 2015

(54) METHOD FOR FABRICATING SEMICONDUCTOR PACKAGE

(71) Applicant: Siliconware Precision Industries Co., Ltd, Taichung (TW)

(72) Inventors: Yan-Heng Chen, Taichung (TW);
Chun-Tang Lin, Taichung (TW);
Chieh-Yuan Chi, Taichung (TW);
Hung-Wen Liu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/146,171

(22) Filed: Jan. 2, 2014

(65) Prior Publication Data
US 2014/0342506 A1    Nov. 20, 2014

(30) Foreign Application Priority Data

May 17, 2013   (TW) .............................. 102117492 A

(51) Int. Cl.
| | | |
|---|---|---|
| *H01L 23/522* | (2006.01) | |
| *H01L 23/495* | (2006.01) | |
| *H01L 21/56* | (2006.01) | |
| *H01L 21/60* | (2006.01) | |
| *H01L 21/768* | (2006.01) | |
| *H01L 23/00* | (2006.01) | |

(52) U.S. Cl.
CPC .......... *H01L 21/76895* (2013.01); *H01L 24/19* (2013.01); *H01L 24/96* (2013.01); *H01L 21/568* (2013.01); *H01L 2224/12105* (2013.01)

(58) Field of Classification Search
CPC .. H01L 2924/1531; H01L 27/00; H01L 21/44
USPC .......... 438/125, 126, 105, 113, 464; 257/675, 257/676, 773
See application file for complete search history.

(56) References Cited

U.S. PATENT DOCUMENTS

| 8,772,913 | B1 * | 7/2014 | Muniandy et al. ............. 257/675 |
| 2003/0057550 | A1 * | 3/2003 | Zhao et al. ..................... 257/734 |
| 2003/0062652 | A1 * | 4/2003 | Lee et al. ........................ 264/227 |
| 2011/0278736 | A1 * | 11/2011 | Lin et al. ......................... 257/774 |
| 2012/0032347 | A1 * | 2/2012 | Chang et al. .................... 257/777 |

* cited by examiner

*Primary Examiner* — Kimberly Rizkallah
*Assistant Examiner* — Brian Turner
(74) *Attorney, Agent, or Firm* — Mintz Levin Cohn Ferris Glovsky and Popeo, P.C.; Peter F. Corless; Steven M. Jensen

(57) ABSTRACT

Disclosed is a method for fabricating a semiconductor package, including providing a package unit having an insulating layer and at least a semiconductor element embedded into the insulating layer, wherein the semiconductor element is exposed from the insulting layer and a plurality of recessed portions formed in the insulating layer; and electrically connecting a redistribution structure to the semiconductor element. The formation of the recessed portions release the stress of the insulating layer and prevent warpage of the insulating layer from taking place.

8 Claims, 3 Drawing Sheets

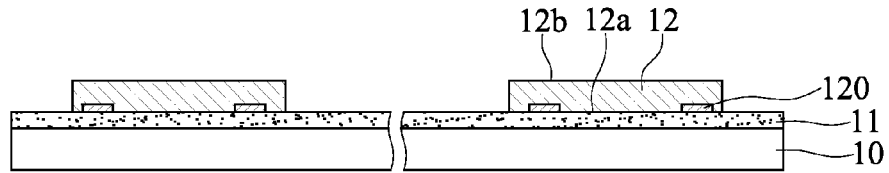
FIG.1A (PRIOR ART)
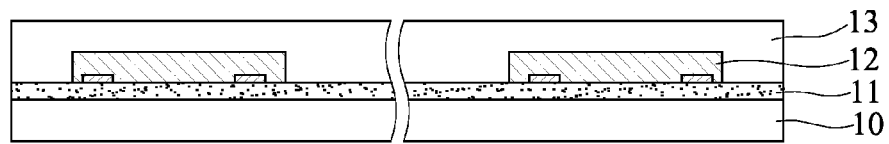
FIG.1B (PRIOR ART)
FIG.1C (PRIOR ART)
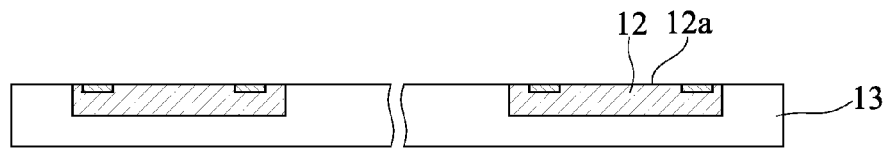
FIG.1D (PRIOR ART)
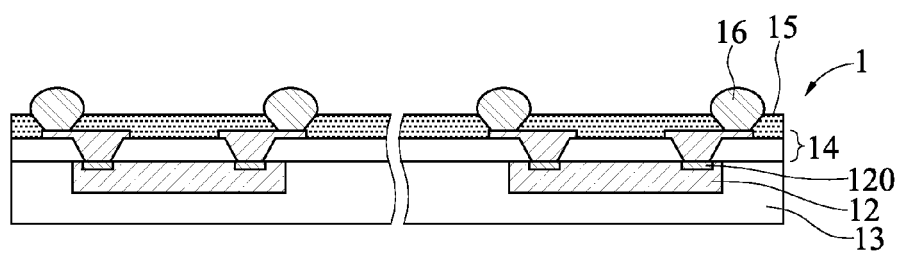
FIG.1D' (PRIOR ART)
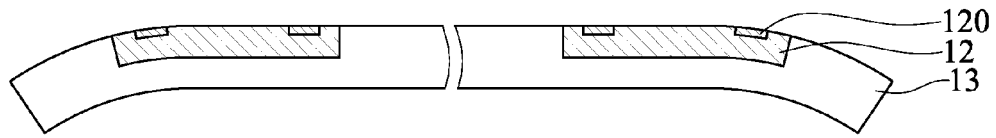

000# METHOD FOR FABRICATING SEMICONDUCTOR PACKAGE

CROSS-REFERENCES TO RELATED APPLICATIONS

This application claims under 35 U.S.C. §119(a) the benefit of Taiwanese Application No. 102117492, filed May 17, 2013, the entire contents of which is incorporated herein by reference.

BACKGROUND OF THE INVENTION

1. Field of the Invention

This invention relates to methods for fabricating a semiconductor package, and, more particularly, to a method for fabricating a semiconductor package having a redistribution structure.

2. Description of Related Art

With the rapid development of the electronic industry, electronic products have a variety of impressive functionalities. In order to meet the compact-size and low-profile requirements, a fan-out type semiconductor package is brought to the market.

FIGS. 1A-1D are cross-sectional views illustrating a method for fabricating a fan-out type semiconductor package 1 according to the prior art.

As shown in FIG. 1A, a carrier member 10 is provided, and an adhesive layer 11 is formed on the carrier member 10.

A plurality of semiconductor elements 12 are disposed on the adhesive layer 11. Each of the semiconductor elements 12 has opposing active surface 12a and non-active surface 12b, a plurality of electrode pads 120 are disposed on the active surface 12a, and the active surface 12a is adhered to the adhesive layer 11.

As shown in FIG. 1B, an insulating layer 13 is formed by a lamination process on the adhesive layer 11 to cover the semiconductor elements 12.

As shown in FIG. 1C, the insulating layer 13 is thermally cured, and the carrier member 10 and the adhesive layer 11 are removed, to expose the active surface 12a of the semiconductor element 12.

As shown in FIG. 1D, a redistribution layer (RDL) process is performed, and a redistribution structure 14 is formed on the insulating layer 13 and the active surface 12a of the semiconductor element 12. The redistribution structure 14 is electrically connected to the electrode pads 120 of the semiconductor element 12.

An insulating protection layer 15 is formed on the redistribution structure 14, and exposes a portion of a surface of the redistribution structure 14, for a conductive element 16 such as a solder bump to be engaged therewith.

However, during the lamination process of the method for fabricating the semiconductor package 1 according to the prior art the insulating layer 13 (i.e., the thermally curing process) generates a great stress and the great stress is dispersed by the carrier member 10. As the carrier member 10 is removed, the great stress causes warpage of the insulating layer 13, as shown in FIG. 1D'. Therefore, the redistribution structure 14 misaligns with the electrode pads of the semiconductor element 12. As the carrier member 10 becomes larger and larger, the location tolerance of the semiconductor element 12 increases accordingly. As a result, the redistribution structure 14 cannot be connected to the electrode pads 120 due to too great the warpage, and the electrical connection between the redistribution structure 14 and the semiconductor element 12 is greatly affected, which results in low yield and poor reliability.

Therefore, how to solve the problems of the prior art is becoming an urgent issue in the art.

SUMMARY OF THE INVENTION

In view of the above-mentioned problems of the prior art, the present invention provides a method for fabricating a semiconductor package, comprising: providing a package unit having an insulating layer and at least a semiconductor element embedded in the insulating layer, wherein the at least a semiconductor element has opposing active surface and non-active surface, the active surface has a plurality of electrode pads disposed thereon, the insulating layer exposing the active surface of the semiconductor element is exposed from the insulating layer and a plurality of recessed portions are formed in the insulating layer; and forming on the active surface of the semiconductor a redistribution structure electrically connected to the electrode pads.

In an embodiment, the package unit is fabricated by: providing a carrier member having a plurality of placement regions defined thereon, with any two of the placement regions spaced apart at an interval; forming on each of the intervals a stopper member having opposing first side and second side, wherein the first side has an opening and the first side of the stopper member is bonded to the carrier member; disposing the at least a semiconductor element on the placement regions via the active surface thereof; forming the insulating layer on the carrier member, the stopper members and the at least a semiconductor element, and forming in the insulating layer the recessed portions that cover the stopper members; and removing the carrier member.

In another embodiment, the package unit is fabricated by: providing a carrier member having a plurality of placement regions defined thereon, with any two of the placement regions being spaced apart at an interval; forming on each of the intervals a stopper member having opposing first side and second side, wherein the first side of the stopper member is bonded to the carrier member; disposing the semiconductor element on the placement regions via the active surface thereof; forming the insulating layer on the carrier member, the stopper members and the semiconductor element, and forming on the insulating layer the recessed portions that cover the stopper members; removing the carrier members to expose the stopper member; and removing the stopper members.

In yet another embodiment, a thin film is formed on the stopper members and is in contact with the insulating layer.

In further another embodiment, the insulating layer is formed by a molding process, a lamination process, or a printing process.

In also another embodiment, the method further comprises forming on the redistribution structure an insulating protection layer having plurality of holes that expose the redistribution structure.

In another embodiment, the method further comprises performing a singulation process along edges of the placement regions after the redistribution structure is formed.

In a method for fabricating a semiconductor package according to the present invention, a plurality of recessed portion that are formed in an insulating layer release the stress of the insulating layer, such that the warpage of the insulating layer is prevented from occurrence.

Therefore, as the carrier member becomes larger and larger, the warpage of the insulating layer can be effectively prevented, and a redistribution structure can be aligned with a semiconductor element accurately, such that the problems that the yield is low and the product reliability is poor are solved, the cost is reduced, and the output is increased.

BRIEF DESCRIPTION OF DRAWINGS

The invention can be more fully understood by reading the following detailed description of the preferred embodiments, with reference made to the accompanying drawings, wherein:

FIGS. 1A-1D are cross-sectional views illustrating a method for fabricating a semiconductor package according to the prior art, wherein FIG. 1D' shows a practical situation of FIG. 1D.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 2A-2F are cross-sectional views illustrating a method for fabricating a semiconductor package 2 according to the present invention.

Figure 2A:
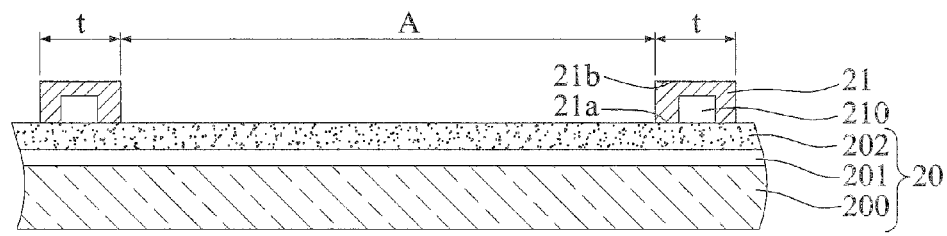
FIGS. 2A-2F are cross-sectional views illustrating a method for fabricating a semiconductor package according to the present invention, wherein FIG. 2B' is a top view of FIG. 2B, and FIGS. 2A' and 2D' are another embodiments of FIGS. 2A and 2D, respectively.
Figure 2A:
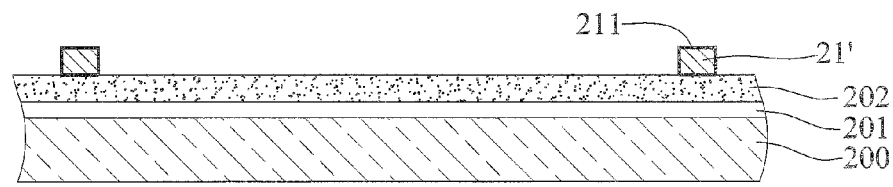
Figure 2B:
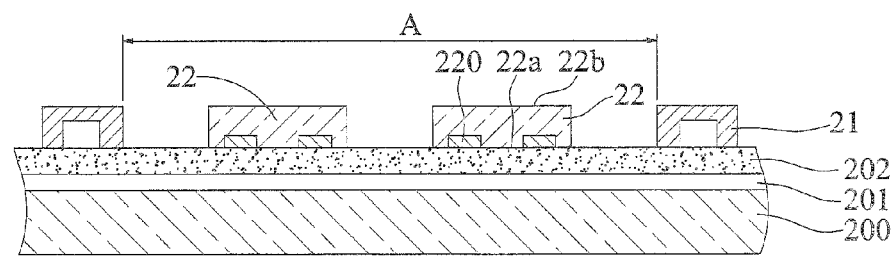
Figure 2B:
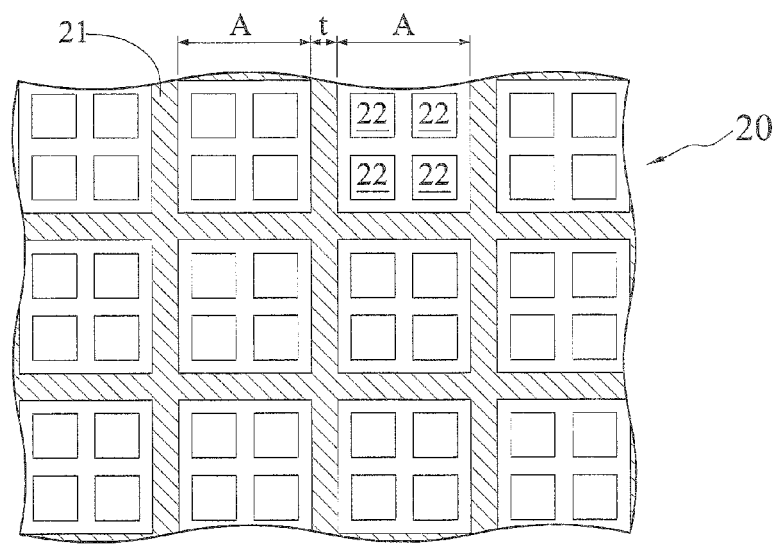

As shown in FIGS. 2A and 2B', a carrier member 20 is provided. The carrier member 20 has a plurality of placement regions A defined thereon, and any two of which are spaced apart at an interval t. A stopper member 21 is formed on each of the intervals t.

In an embodiment, the carrier member 20 is a wafer type substrate or a panel-type substrate. The carrier member 20 comprises a glass carrier board 200, on which a release layer 201 and an adhesive layer 202 are formed subsequently.

The stopper member 21 has opposing first side 21a and second side 21b. The first side 21a has an opening 210. The first side 21a of the stopper member 21 is bonded to the adhesive layer 202 of the carrier member 20.

In another embodiment, as shown in FIG. 2A', a thin film 211 may be formed on a surface of the stopper member 21' and the thin film 211 can be made of a material such as a release material or a chromium material, and is free from the formation of the opening 210. The thin film 211 can be formed on a side surface, a bottom surface and/or a top surface of the stopper member 21' on demands.

As shown in FIGS. 2B and 2B', a plurality of semiconductor elements 22 are disposed in a single placement region A. Each of the semiconductor elements 22 has opposing active surface 22a and non-active surface 22b. A plurality of electrode pads 220 are disposed on the active surface 22a. The active surface 22a is bonded to the adhesive layer 202 in the placement regions A.

In an embodiment, four semiconductor elements 22 are disposed in a single placement region A. However the number of the semiconductor elements 22 to be disposed in the single placement region A is not limited thereto. More semiconductor elements 22 are allowed to be mounted in a single placement region A when necessary and allowed.

Figure 2C:
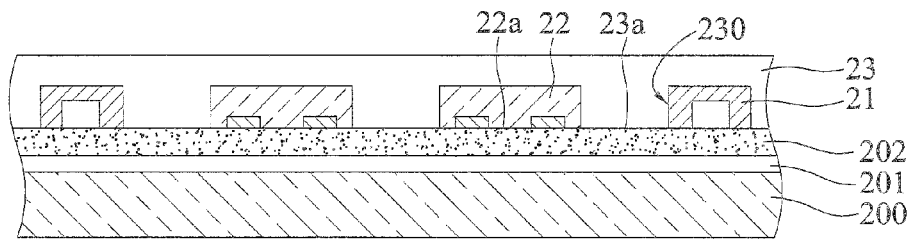

As shown in FIG. 2C, an insulating layer 23 is formed on the adhesive layer 202 of the carrier member 20, the stopper members 21 and the semiconductor element 22. A plurality of recessed portions 230 are formed in the insulating layer 23 and cover the stopper members 21.

In an embodiment, the insulating layer 23 is a thin film formed by a lamination process. In another embodiment, the insulating layer 23 is a packaging resin formed by a molding process or a resin material formed by a printing process. No specific limit is placed on the selection of the material of the insulating layer 23.

During the formation of the insulating layer 23, stress is increased. However, the carrier member 20 can effectively release the stress.

The active surface 22a of the semiconductor element 22 and a surface 23a of the insulating layer 23 are coplanar.

Figure 2D:
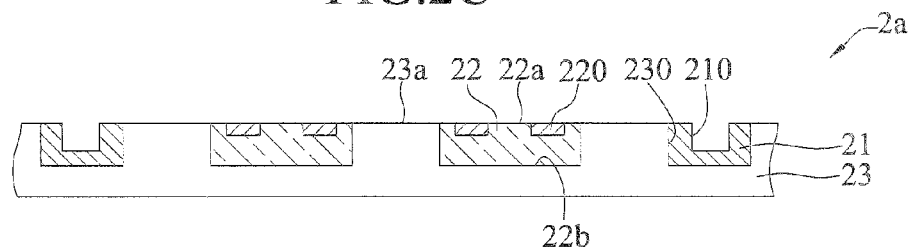
Figure 2D:
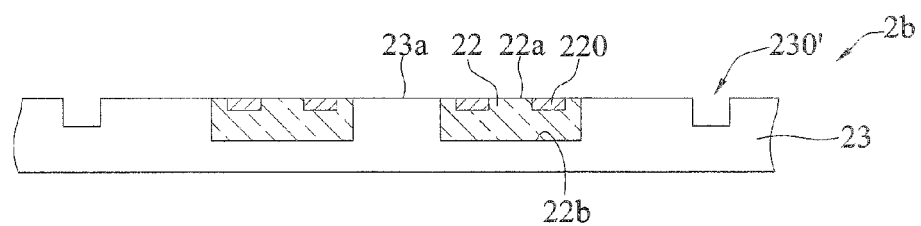

As shown in FIG. 2D, the carrier board 200 and the release layer 201 and the adhesive layer 202 that are formed on the carrier board 200 are removed, so as to expose the active surface 22a of the semiconductor element 22 and the opening 210 of each of the stopper members 21. Equivalently, a plurality of recessed portions 230 are formed in the insulating layer 23 so as to receive the stopper members 21 in the recessed portions 230. The openings 210 are then exposed to form a package unit 2a. The stress in the insulating layer 23 can be released by the recessed portions 230 to the stopper members 21, and further released by the opening 210 of each of the stopper members 21. Therefore, the warpage of the insulating layer 23 can be prevented from occurrence.

Subsequent to the process shown in FIG. 2A', after the carrier member 20 is removed and the active surface 22a of the semiconductor element 22 and the stopper members 21' are exposed, the stopper members 21' are removed, as shown in FIG. 2D', so as to form a plurality of recessed portions 230' in the insulating layer 23. A package unit 2b is then obtained. Through the design of the thin film 211, the stopper member 21' can be easily separated from the insulating layer 23.

In an embodiment, the recessed portions 230 and 230' are in the shape of a groove or a hole.

After the carrier member 20 is removed, the recessed portions 230 and 230' release the stress of the insulating layer 23, so as to effectively prevent the warpage of the insulating layer 23 from occurrence.

Figure 2E:
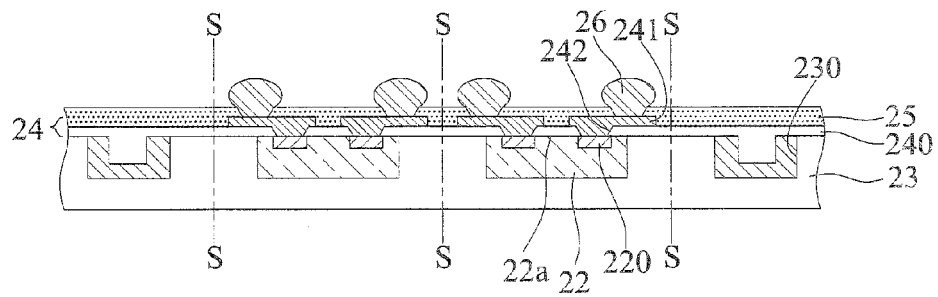

As shown in FIG. 2E, an RDL process is performed to form on the active surface 22a of the semiconductor element 22 and the insulating layer 23 a redistribution structure 24 that is electrically connected to the electrode pads 220.

In an embodiment, in the RDL process a dielectric layer 240 is formed on the recessed portions 230 and 230' and on the active surface 22a of the semiconductor element 22 and the insulating layer 23, and a circuit layer 241 is subsequently formed on the dielectric layer 240 and electrically connected to the electrode pads 220 via the conductive vias 242 in the dielectric layer 240. Therefore, the redistribution structure 24 that has a single circuit layer 241 is formed.

An insulating protection layer 25 is formed on the dielectric layer 240 and the circuit layer 241. The insulating protection layer 25 has a plurality of holes for exposing the circuit layer 241. Conductive elements 26 such as solder bumps are formed in the holes.

In an embodiment, the dielectric layer 240 is made of polyimide (PI), benezocy-clobutene (BCB) or polybenzoxazole (PBO).

In another embodiment, the redistribution structure comprises a plurality of circuit layers, e.g., including a plurality of dielectric layers 240 and a plurality of circuit layer 241 formed on the dielectric layers 240.

Figure 2F:
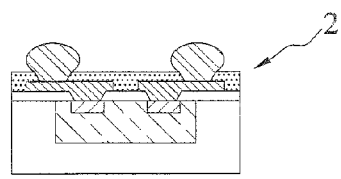

As shown in FIG. 2F, a singulation process is performed along a cutting route S, i.e., edges of the placement regions A, to fabricate a plurality of semiconductor packages 2 and remove the stopper members 21 (or an area in which the recessed portions 230 and 230' are formed).

In a method for fabricating a semiconductor package according to the present invention, the stopper members 21 and 21' are formed around the semiconductor element 22, and the recessed portions 230 and 230' can thus be formed in the insulating layer 23 after the carrier member 20 is removed, such that the stress of the insulating layer 23 can be released and the warpage of the insulating layer 23 is effectively prevented.

As the carrier member 20 becomes larger and larger, the warpage of the insulating layer 23 can be effectively prevented accordingly. As a result, during the fabrication of the redistribution structure 24, the conductive vias 242 can be aligned with the semiconductor element 22 accurately. Therefore, the problems of the prior art that the yield is low and the reliability is poor are solved, the cost is reduced, and the output is increased.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method for fabricating a semiconductor package, comprising:
   providing a package unit having an insulating layer, a plurality of stopper members, and at least a semiconductor element embedded in the insulating layer, wherein each of the stopper members has an opposing first side and second side, the first side has an opening to form a recessed portion in the insulating layer, the at least a semiconductor element has an opposing active surface and non-active surface, the active surface has a plurality of electrode pads disposed thereon, and the active surface of the at least a semiconductor element is exposed from the insulating layer;
   forming on the active surface of the at least a semiconductor element a redistribution structure electrically connected to the electrode pads; and
   performing a singulation process and removing all of the stopper members and the recessed portions.

2. The method of claim 1, wherein the insulating layer is formed by a molding process, a lamination process or a printing process.

3. The method of claim 1, wherein the package unit is fabricated by:
   providing a carrier member having a plurality of placement regions defined thereon, wherein any two of the placement regions are spaced apart at an interval;
   forming on each of the intervals a respective one of the stopper members, wherein the first side of the respective one of the stopper members is bonded to the carrier member;
   disposing the at least a semiconductor element on the placement regions via the active surface thereof;
   forming the insulating layer on the carrier member, the stopper members and the at least a semiconductor element, and forming in the insulating layer the recessed portions that cover the stopper members; and
   removing the carrier member.

4. The method of claim 1, wherein the singulation process is performed after the redistribution structure is formed.

5. The method of claim 1, wherein the singulation process is performed along edges of the placement regions.

6. A method for fabricating a semiconductor package, comprising:
   providing a carrier member having a plurality of placement regions defined thereon, wherein any two of the placement regions are spaced apart at an interval;
   forming on each of the intervals a stopper member having opposing first side and second side, wherein the first side of the stopper member is bonded to the carrier member;
   disposing at least a semiconductor element on the placement regions via an active surface thereof, wherein the at least a semiconductor element has a non-active surface opposing the active surface, and the active surface has a plurality of electrode pads disposed thereon;
   forming an insulating layer on the carrier member, the stopper members and the at least a semiconductor element such that the at least a semiconductor element is embedded in the insulating layer;
   removing the carrier member to expose the stopper members;
   removing the stopper members to form a plurality of recessed portions in the insulating layer;
   forming on the active surface of the at least a semiconductor element a redistribution structure electrically connected to the electrode pads; and
   performing a singulation process and removing the recessed portions.

7. The method of claim 6, wherein the stopper member has a thin film formed thereon allowing the thin film to be in contact with the insulating layer.

8. The method of claim 1, further comprising forming on the redistribution structure an insulating protection layer having a plurality of holes for exposing the redistribution structure.

* * * * *